United States Patent [19]

Muller et al.

[11] Patent Number: 4,816,125

[45] Date of Patent: Mar. 28, 1989

[54] IC PROCESSED PIEZOELECTRIC MICROPHONE

[75] Inventors: Richard S. Muller, Kensington; Eun S. Kim, Berkeley, both of Calif.

[73] Assignee: The Regents of The University of California, Berkeley, Calif.

[21] Appl. No.: 217,826

[22] Filed: Aug. 19, 1988

Related U.S. Application Data

[62] Division of Ser. No. 125,375, Nov. 25, 1987, Pat. No. 4,783,821.

[51] Int. Cl.[4] .......................... C23C 14/34; H04R 31/00

[52] U.S. Cl. .................................. 204/192.18; 29/594

[58] Field of Search ...................... 204/192.15, 192.17, 204/192.18; 29/594; 381/173

[56] References Cited

PUBLICATIONS

J. R. Sank, *J. Andio Eng. Soc.*, vol. 28, No. 6, Jun. 1980, pp. 433–436.

*Primary Examiner*—Aaron Weisstuch

*Attorney, Agent, or Firm*—Owen, Wickersham & Erickson

[57] ABSTRACT

A miniature diaphragm pressure transducer. A thin diaphragm of silicon nitride has an upper face covered by a zinc-oxide piezoelectric film encapsulated in chemical vapor deposited silicon dioxide. A series of annular, basically conentric, polysilicon electrodes are provided in the silicon dioxide between the piezoelectric film and the diaphragm and in contact with the piezoelectric film. A series of annular, basically concentric, aluminum electrodes are on the opposite side of the piezoelectric film from the polysilicon electrodes and are aligned with the polysilicon electrodes; they lie over the silicon dioxide, and are in contact with the piezoelectric film.

3 Claims, 5 Drawing Sheets

FIG. 6
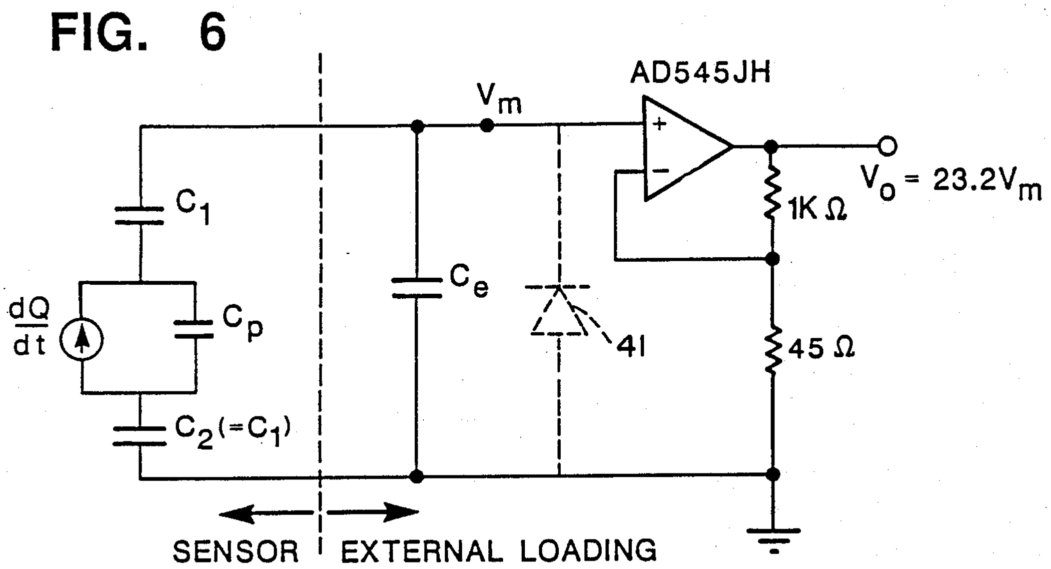
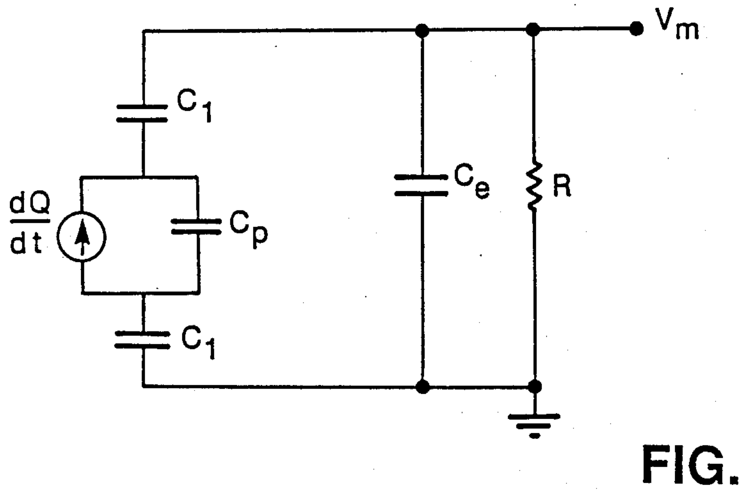
FIG. 7

IC PROCESSED PIEZOELECTRIC MICROPHONE

This is a divisional of co-pending application Ser. No. 125,375, filed on Nov. 25, 1987, now U.S. Pat. No. 4,783,821.

This invention relates to a miniature diaphragm pressure transducer or microphone having sensitivity to acoustic signals at the level of conversational speech. The microphone is fabricated by combining micromachining procedures to produce a thin silicon-nitride diaphragm having a patterned ZnO thin-film layer. The ZnO layer is deposited on the thin micromachined disphragm made of LPCVD silicon nitride and acts as a piezoelectric transducer.

The diaphragm of the transducer is very thin, e.g. 2 $\mu$m in thickness, which is the thinnest yet reported to be used with a piezoelectric-readout structure of relatively large area, e.g., $3\times3$ mm$^2$. By special processing, the thin silicon nitride diaphragm can be made to retain its shape and not to warp as usually happens when thin layers of other materials, including elemental silicon are used in its place. The ZnO film is sputtered in a planar magnetron sputter-deposition unit and is 0.3 $\mu$m thick. A transducer according to this invention has been made and tested and has shown an unamplified response of roughly 50 $\mu$V per $\mu$bar when excited by sound waves at 1 kHz with the variation of the sensitivity from 20 Hz to 4 kHz being approximately 9 dB. These results were obtained using a 0.1 mm-wide annular pattern of ZnO piezoelectric that measured 3.6 mm in circumference.

BACKGROUND OF THE INVENTION

Over the past several years, IC technology has been applied to the production of various sensing devices and to the integration of sensors and circuits. Among the many advantages of this approach are precision and designability, extreme miniaturization, integration with signal-detection and conditioning circuits, and low cost, as a result of batch processing.

The most widely applied microprocessed silicon sensors have been diaphragm pressure transducers, particularly for applications at near atmospheric pressures.

Previous diaphragm sensors with piezoelectric readouts have used diaphragms made of single-crystal silicon. Control of the thickness and of the latent stress in such diaphragms was inadequate for use at very thin dimensions. The best result reported, of which we know, is in *Sensors and Actuators* 4 (1983) 357–362, an article by Royer et al., which employed a diaphragm of elemental silicon 30 $\mu$m thick and a ZnO piezoelectric film 3–5 $\mu$m thick. The diaphragm then was 3 mm in diameter and the readout piezoelectric film consisted of an outer and an inner electrode concentric to each other and positioned on both sides of the ZnO film. The reported sensitivity was 25 $\mu$V per $\mu$bar a signal-to-noise ratio of 5:1 at 2 $\mu$bar, a frequency response of 0.1 Hz to 10kHz with a $10^{10}\Omega$ shunt resistor, and a power consumption below 40 microwatts.

SUMMARY OF THE INVENTION

The invention comprises a miniature diaphragm pressure transducer. A diaphragm of silicon nitride, having an area of 5–15mm$^2$, preferably about nine mm$^2$, and a thickness of only about 2 $\mu$m, has a lower face supported on an oxide layer on the surface of a silicon base or wafer. A piezoelectric zinc-oxide film about 0.3 $\mu$m thick, encapsulated in chemical vapor deposited silicon dioxide, covers the upper face of the diaphragm. A series of annular, basically concentric, polysilicon electrodes, are encapsulated in the silicon dioxide between the piezoelectric film and the diaphragm. A series of annular, basically concentric, aluminum electrodes on a silicon-dioxide layer overlying the opposite side of the piezoelectric film from the polysilicon electrodes, are aligned with the polysilicon electrodes.

The invention also includes a method for making a miniature diaphragm pressure transducer. The method comprises the main steps of:

(1) depositing a thin silicon-nitride film over a thermally grown silicon-dioxide layer on a silicon base using low-pressure chemical-vapor deposition with dichlorosilane and ammonia at a gas ratio of 5 to 1 to produce a substantially stress-free silicon-nitride film, (2) anisotropically etching the silicon base to detach, at least partially, the film from the base and thereby provide a silicon-nitride diaphragm with two faces, (3) applying a first layer of chemical-vapor deposited silicon dioxide to one face of the diaphragm, (4) forming a series of annular, basically concentric, polysilicon electrodes over the first layer, (5) applying a second layer of chemical-vapor deposited silicon dioxide over the polysilicon electrodes, (6) sputter-depositing a piezoelectric film of zinc oxide over the second layer, (7) applying a third layer of chemical-vapor deposited silicon dioxide over the piezoelectric film, (8) opening up some contact holes in the second and the third layer, and (9) sputter-depositing a series of annular, basically concentric, aluminum electrodes aligned with the polysilicon electrodes and having contact means extending through the contact holes to provide contact with the piezoelectric film.

This method has been used to produce a transducer that is sensitive to signals in the $\mu$bar range, a sensitivity level associated with audio microphones. The microphone has been demonstrated to pick up a low-level audio signal.

The silicon-nitride diaphragm was deposited essentially stress-free using techniques similar to those described by Sekimoto and co-workers in *J. Vac. Sci Technology*, Vol. 21, pp 1017–1021, Nov.–Dec. 1982. The diaphragm was mechanically robust and planar when deposited at higher temperatures and higher gas ratios (between the reactant gas $SiH_2Cl_2$ and the nitrogen source $HN_3$) than is usual in conventional IC applications of nitride. The strength and planarity of such a thin diaphragm is believed to be novel.

BRIEF DESCRIPTION OF THE DRAWINGS

FIG. 6 is an equivalent schematic circuit diagram of the tested device and the measurement set-up.

FIG. 7 is a diagram of a simplified circuit based on that of FIG. 6.

DESCRIPTION OF A PREFERRED EMBODIMENT

DEVICE STRUCTURE AND FABRICATION

Figure 1:
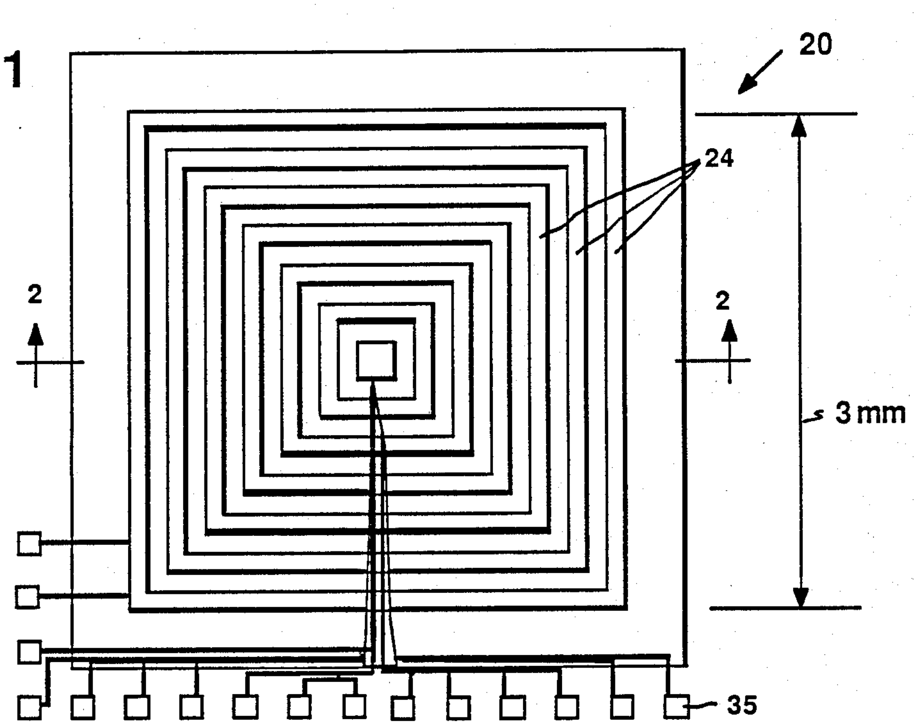
FIG. 1 is a top plan layout, much enlarged, of a sensor embodying the principles of the invention.
Figure 2:
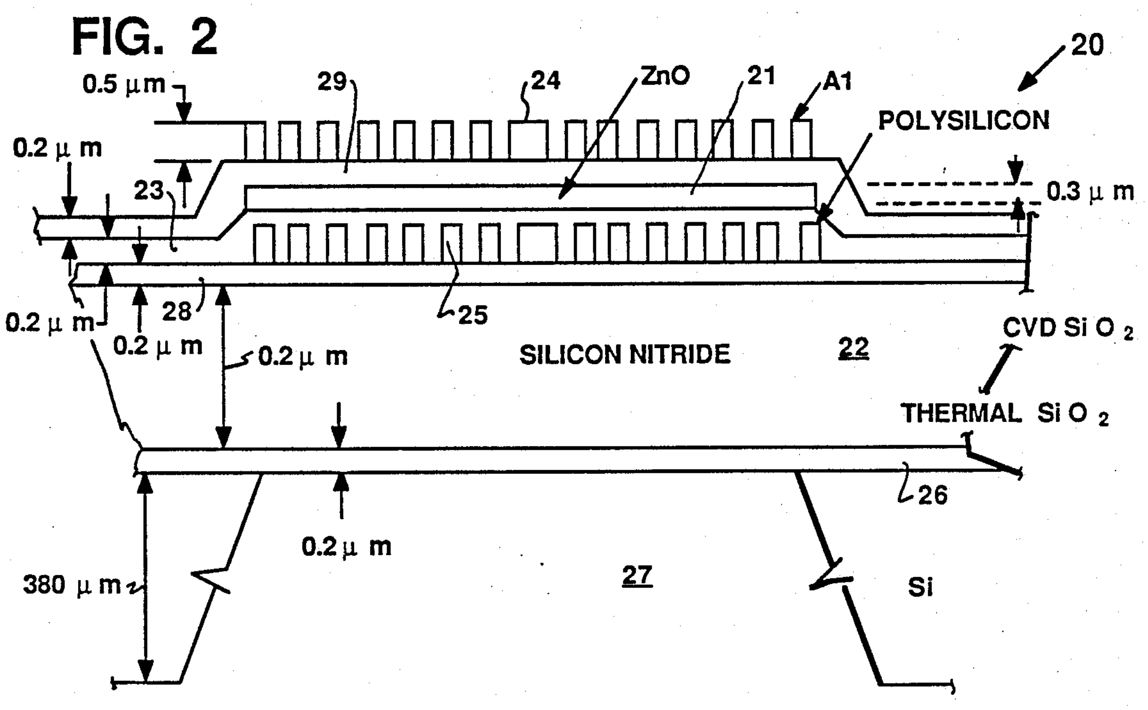
FIG. 2 is a view in section taken along the line 2—2 in FIG. 1.

FIGS. 1 and 2 respectively show a top view and a cross section of a micromachined sensor 20 embodying the principles of the invention. A piezoelectric ZnO film 21 is patterned to cover a square diaphragm 22 (typically 3 mm square) formed of silicon nitride. The ZnO film 21 is encapsulated in layers 23 and 29 of chemically vapor deposited (CVD) silicon dioxide each 0.2 $\mu$m thick deposited at 450° C. Both aluminum top electrodes 24 and polycrystalline silicon bottom electrodes 25 are segmented with annular patterns like that shown in FIG. 1. The segmented annular patterns (1) enable higher sensitivity to be obtained from the electrodes that cover the area of larger stress, (2) temperature compensation and additive signals can be obtained by proper connections of one electrode, and (3) various experiments become possible. One particular interest is that the sensitivity can be increased up to an order of magnitude by proper connections of electrodes.

Five masks were used in the fabrication process for the device of FIGS. 1 and 2; this is potentially compatible with any of several IC processes. The main fabrication steps may be as follows: The silicon nitride is deposited at about 835° C. over a layer 26 of 22 thermally-grown oxide covering a base or wafer 27 of silicon, using low-pressure chemical vapor deposition (CVD) in an ambient of dichlorosilane to ammonia at a gas ratio of 5 to 1. This deposition condition produces almost stress-free silicon-nitride films, an achievement important in the thin diaphragm of the present invention. Anisotropic etchant (EPW) is used to form the silicon-nitride diaphragm 22 by etching the silicon wafer 27 from the backside. The silicon-nitride diaphragm 22 may measure $3 \times 3$ mm$^2$ and its thickness may be 2 $\mu$m. The polysilicon electrodes 25 are then formed on the diaphragm 22 over a layer 28 of CVD $SiO_2$. Next, another layer 23 of CVD $SiO_2$ is deposited, and over this a layer 21 of ZnO as thin as 0.3 $\mu$m is sputter-deposited with its c-axis oriented perpendicularly to the plane of the diaphragm 22. Aluminum 24 is sputter-deposited after a layer 29 of CVD $SiO_2$ is laid down to encapsulate the ZnO and contact windows have been opened. Patterning and sintering of A1 complete the fabrication process.

An advantage of this processing sequence is that front-to-backside alignment and protection from EPW etchant problems are avoided, because the diaphragm 22 is formed early in the process. If the sensor 20 were part of an IC process, however, it might be better to form the diaphragm 22 in the last stages of the process.

Figure 3:
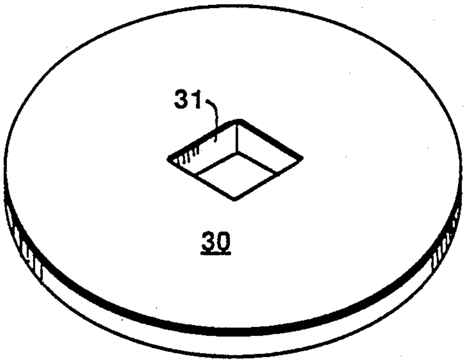
FIG. 3 is a view in perspective of a wafer used to support the sensor of FIGS. 1 and 2 during some tests.
Figure 4:
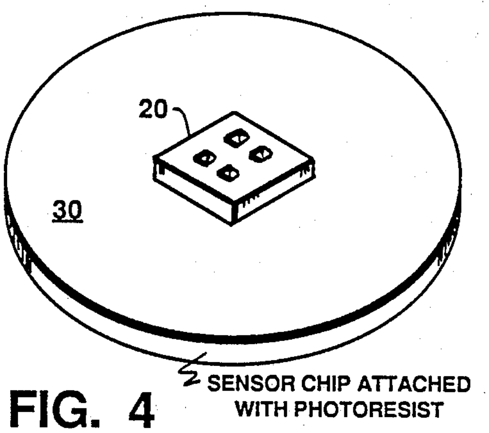
FIG. 4 is a view like FIG. 3 with the wafer in place.
Figure 5:
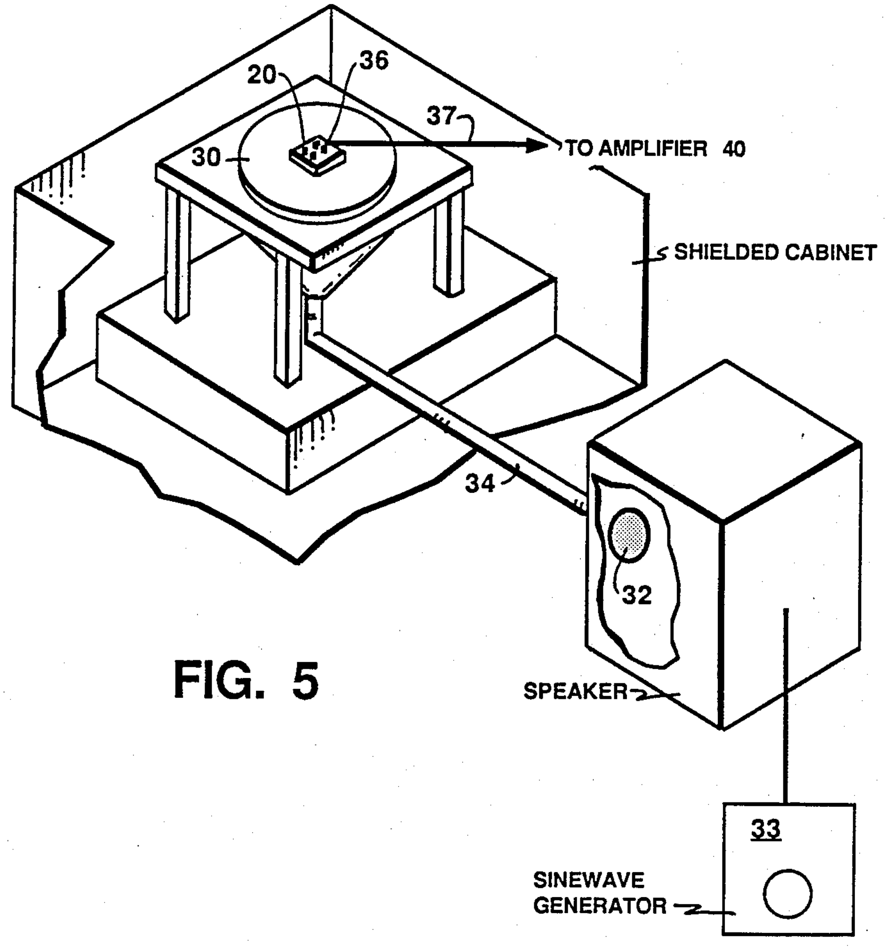
FIG. 5 is a schematized view in perspective of the test apparatus embodying the wafer and sensor of FIG. 4.

The sensor 20 was tested using apparatus like that shown in FIGS. 3, 4, and 5. A diced sensor chip 20 was mounted on a 4-inch wafer 30 for mechanical support. As shown in FIG. 3, a 1-cm square hole 31 was made in the wafer 30, so that the pressure signal could be applied to the diaphragm 22 through the hole 31 in the 4-inch support wafer 30. A 4-inch paper-cone loudspeaker 32 driven by a sine-wave generator 33 was used for the pressure source. Sound was propagated through a ¾" plastic tube 34, and was applied to the sensor diaphragm 22 through the backside of the sensor chip 20 exposed through the square hole 31 in the support wafer 30. A special chuck, as shown in FIG. 5, was developed for this experiment. The sensor 20 was probed on bonding pads 35, and the probes 36 were connected to an amplifier 40 (See FIG. 6) through coaxial cables 37. The sensor 20, the probe station, and the amplifier 40 were located inside a shielded cabinet to eliminate any electromagnetic interference. Pressure levels appearing on the sensor chip 20 were characterized over the audio frequency range using a GR1982 Precision Sound-Level Meter and Analyzer.

The pressure sensor 20 and its external circuitry may be modeled electrically by an equivalent circuit shown in FIG. 6. Feedback around the operational amplifier establishes a voltage gain $v_o/v_m$ of 23.2. A diode 41, shown dotted on FIG. 6, is present only to provide a very high resistance ($>10^{10}\Omega$) so that a tiny leakage path will be present to drain off charges picked up from static electricity. A capacitor $C_e$ is comprised of two components, one due to the probe 36 ($\approx$40pF) and another due to the coaxial cable 37 (also$\approx$40pF).

The capacitances $C_1$, $C_2$, and $C_p$ for the sensor (shown in FIG. 6) are due to the ZnO layer 21 ($C_p$) and the two silicon-dioxide layers 23 and 29 on the top and bottom of the ZnO layer 21 ($C_1$ and $C_2$). The current source represents the piezoelectric activity of the ZnO layer 21, which becomes strained when pressure deflects the silicon-nitride diaphragm 22. Strain in the piezoelectric material 21 produces a polarization and surface charges that are mirrored on the aluminum and polysilicon electrodes 24 and 25. For a sinusoidal pressure variation at a radial frequency $\omega$, there is a sinusoidal piezoelectrically induced charge of $Q_0e^{j\omega t}$, where $Q_0$ is proportional to the applied pressure. The current source is dQ/dt.

The external loading shown in FIG. 6 simplifies to a parallel-connected RC load shown in FIG. 7. Solving for $v_m$, the unamplified output of the sensor in FIG. 7, $$v_m = j\omega Q_o e^{j\omega t}\frac{R}{1 + \frac{2C_p}{C_1} + j\omega R\left(C_e + 2C_p\frac{C_e}{C_1} + C_p\right)} \quad (1)$$

In Eq. (1), $$\text{if } \omega R\left(C_e + 2C_p\frac{C_e}{C_1} + C_p\right) >> \left(1 + \frac{2C_p}{C_1}\right), \text{ then} \quad (2)$$

$$V_m \approx \frac{Q_0 e^{j\omega t}}{C_e + 2C_p\frac{C_e}{C_1} + C_p}$$

For a squared-off annular pattern that measures 3.6 mm in circumference and 0.1 mm in width:

$$C_p = 109 \text{ pF (measured)}, C_1 = C_2 =$$

$$\frac{\epsilon ox}{\epsilon \text{ZnO}} \frac{t_{ZnO}}{t_{ox}} C_p = 0.66\ C_p.$$

Since $R>10^{10}\Omega$ and $C_e\approx 80\text{pF}=0.735C_p$, the approximation condition stated after Eq. (1) is satisfied for a frequency f>10 Hz. Hence, for the audio range, $$V_m = \frac{Q_o e^{j\omega t}}{C_e + 2C_pC_e/C_1 + C_p} = \frac{Q_o e^{j\omega t}}{3.96\ C_p} \quad (3)$$

Finally, if $C_e << C_p$, then $$V_{m,ideal} \approx \frac{Q_o e^{j\omega t}}{C_p} = 3.96\ v_m. \quad (4)$$

From Eq. (4), it is seen that if $C_e$, the external loading capacitance, is made much less than $C_p$, the self-capacitance of the piezoelectric film, the derived signal will nearly quadruple. An on-chip integrated amplifier would easily accomplish this; so it is reasonable to multiply the measured sensitivity of the sensor by a factor of 4 to estimate the true performance of an integrated device.

Figure 8:
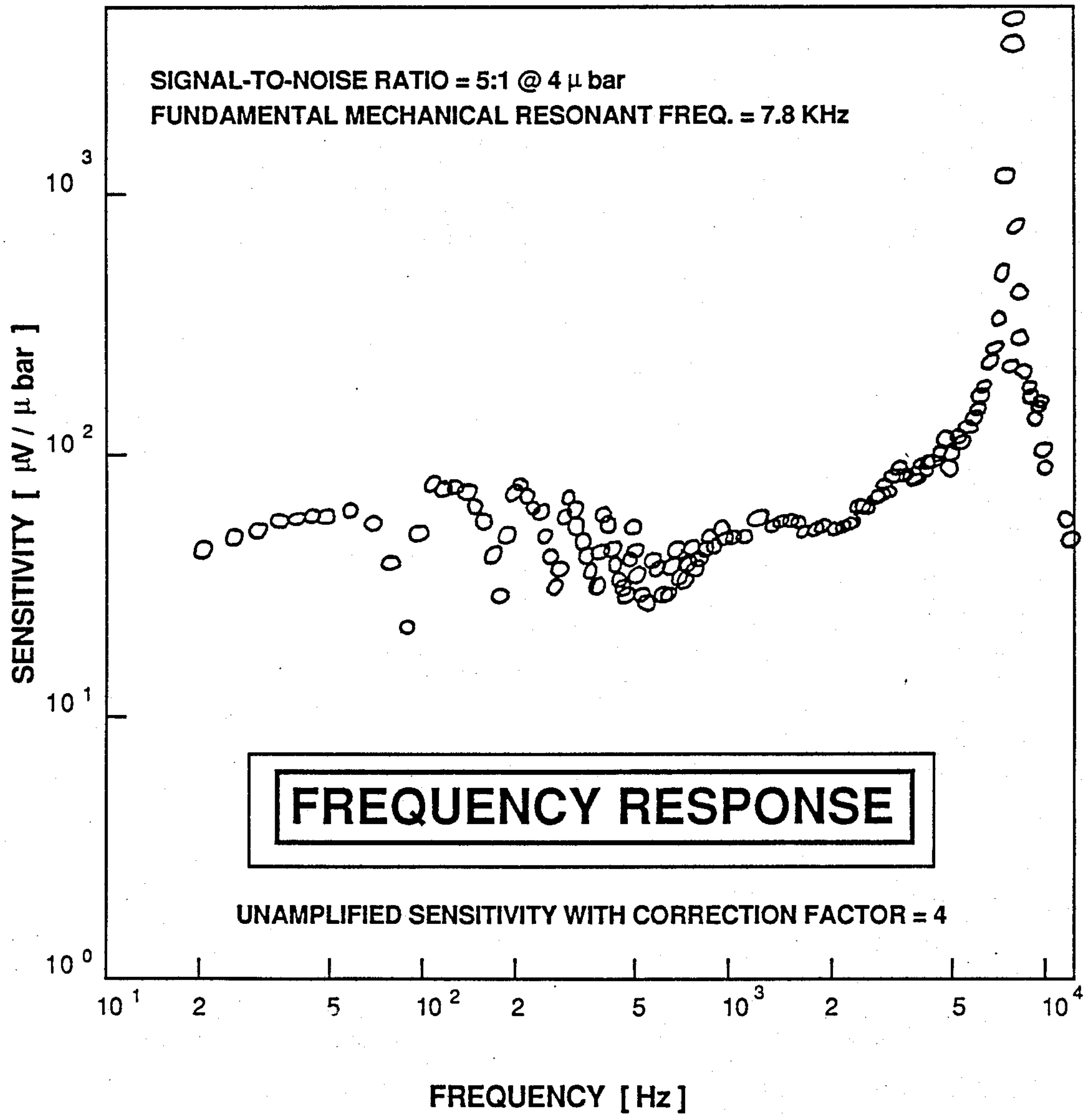
FIG. 8 is a graph showing the frequency response of the sensor tested.

Plotted in FIG. 8 are values of $v_m$ derived from measurements of $v_o$ by dividing by the gain (23.2) of the op-amp circuit and multiplying by the correction factor (4) explained above. The variation of sensitivity from 20 Hz to 4 kHz is approximately 9 dB with the typical sensitivity being 50 $\mu$V/$\mu$bar. A fundamental mechanical resonance in the diaphragm occurs at 7.8 kHz with Q>20 as predicted from the theory of plate vibration. The signal-to-noise ratio at 4 $\mu$bar is 5:1.

Figure 9:
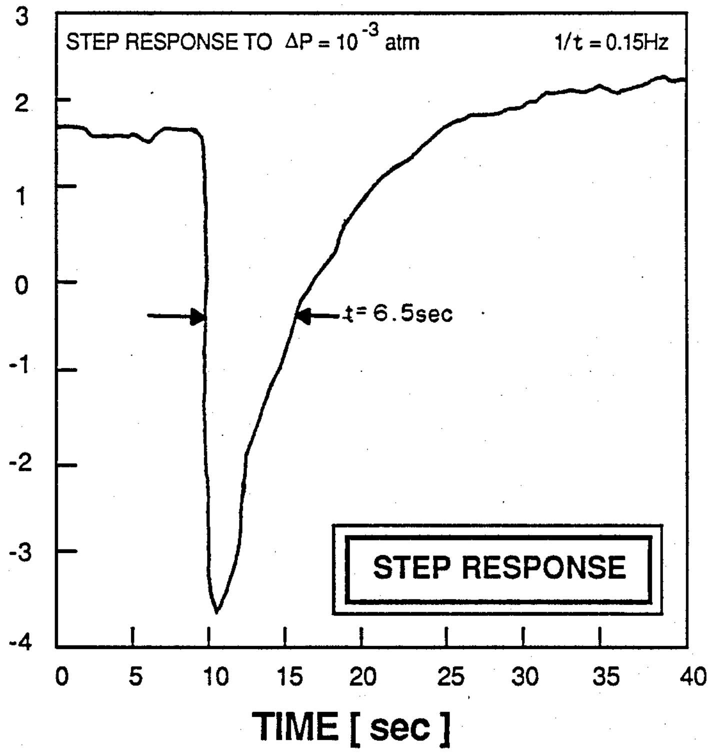
FIG. 9 is a graph of the response of the same sensor to a step change of air pressure.
Figure 10:
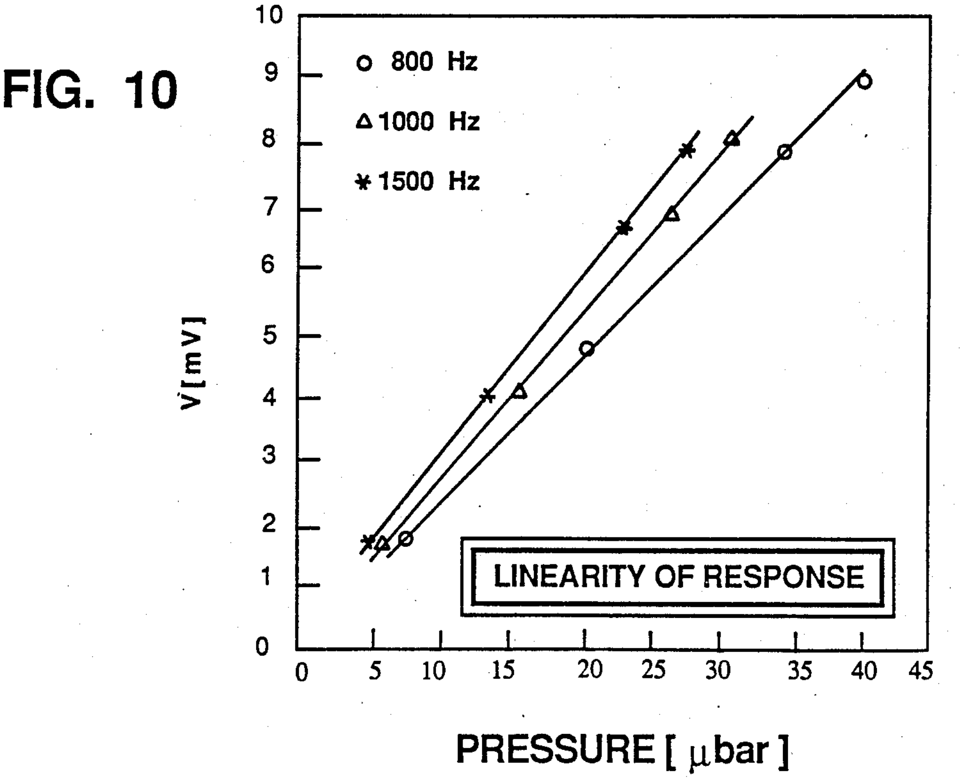
FIG. 10 is a graph of the response of the sensor at three different frequencies, showing linear dependence on pressure.

FIG. 9 shows the response of the sensor 20 to a step change in air pressure. As can be seen in the figure, the decay time is 6.5 seconds, which means that the sensor 20 can be operated down to 0.15 Hz. This low-frequency response was expected, because the ZnO layer 21 is encapsulated in CVD $SiO_2$. An even lower-frequency response, characterized by a step response in the order of days, is possible if there is a smaller leakage through the encapsulating layers. The linearity of the response to applied variations in pressure is shown in FIG. 10 at several different frequencies.

DETAILED DESCRIPTION OF FABRICATION STEPS

Step 1. Preparation of wafer (base)

1. Silicon wafers without visual defects are selected, inspecting the wafers under a yellow light.
2. The wafer is "piranha cleaned" for 15 minutes. To make piranha, add five parts of $H_2SO_4$ to one part of $H_2O_2$.
3. The wafer is then rinsed in de-ionized water for 10 seconds in each of 3 beakers successively and spray rinsed.
4. To remove surface oxide, the wafer is dipped in 10:1 etching solution of $H_2O$:HF for 20 seconds until hydrophobic.
5. The wafer is then rinsed in de-ionized water for 10 seconds in each of 3 beakers successively, followed by a polymetrics rinse until the resistivity meter indicates a resistance 10~15MΩ. A water break test may be performed to confirm the results.

To remove any residue of organic contaminants, a mixture of $H_2O$:$H_2O_2$:$NH_4OH$, 5:1:1 is used at 60° C. for 15 minutes. Metal tweezers can also be cleaned by this solution.

Step 2. Initial oxidation in a Tylan Furnace: the target being a 210 nm layer of silicon dioxide.

This may be done by wet oxidation at 1000° C., using:
5 minutes of dry $O_2$
30 minutes of wet $O_2$
5 minutes of dry $O_2$
20 minutes of dry $O_2$.

Step 3. Silicon nitride deposition in a Tylan Furnace, the target being a 2 $\mu$m layer of silicon nitride.

For this deposition the gas flow rates are preferably: $NH_3$ at 16 sccm and $SiH_2Cl_2$ at 80 sccm The unit "sccm" is the abbreviation for standard cc per minute referred to standard temperature (0° C.) and standard pressure (760 Torr).

The deposition temperature is 835° C., and the deposition time is 5 hours.

Step 4. Diaphragm area definition on the backside of the silicon wafer.

Part A.

A wafer is baked under infra-red lamp for 10 minutes, or at 120° C. for 20 minutes to achieve dehydration.

This is followed by hexamethyldisilazane (HMDS) treatment for 2 minutes, and

Spinning photoresist AZ-1450J (manufactured by Shipley Co.) at 3000 rpm for 30 seconds on the front side of the wafer.

Then the wafer is softbaked at 90° C. for 15 minutes followed by

Spin photoresist AZ-1450J (manufactured by Shipley Co.) at 6000 rpm for 30 seconds on the back side of the wafer.

The wafer is again softbaked at 90° C. for 15 minutes and the film on the back side of the wafer is exposed, e.g., at a Canon setting = 5.6

The exposed film is developed in photoresist developer, a Microposit 351 (manufactured by Shipley Co.), which is diluted with de-ionized water at a 1:5 ratio, for 72 seconds, with slow agitation.

This is followed by a rinse in de-ionized water for 10 seconds in each of 3 beakers and then a polymetric rinse, after which it is spin-dried, and then Hardbaked at about 120° C. for 15 minutes.

Part B. Silicon Nitride Plasma Etching

1. The silicon nitride is treated with $O_2$ plasma descum at 50 watts and 300 mTorr (36.7 sccm) for 2 minutes.
2. The silicon nitride is then etched on the back side of the silicon wafer, at gas flow rates: $SF_6$ at 13 sccm, He at 21 sccm. These flow rates correspond to 220 mTorr of pressure in the chamber.
   Power: 100 Watts
   Measured Etch Rate about 70 nm/min.
   Etching Time about 30 minutes.

Part C.

Thermal oxide is removed from the back side of the wafer by dipping in buffered HF ($NH_4F$:HF, 5:1) for about 2.5 minutes.

The etch rate of the buffered HF (BHF) is about 100 nm/min. for the thermal oxide.

Step 5. Diaphragm formation through backside etching using ethylenediaminepyrocatechol and water (EPW).

1. The photoresist is removed, using acetone, methanol and de-ionized water, successively for 10 minutes in each.
2. The backside of wafer is etched using EPW.
   The EPW Etchant is composed of:
   Ethylenediamine 500 ml
   Pyrocatechol 160 g
   Water 160 ml
   Pyrazine 3 g.

The etch rate is about 84 $\mu m$/hour at 105° C., and the etch time is about 4.5 hours to etch 380 $\mu m$.

3. The wafer is then rinsed in de-ionized water for 10 seconds in each of 3 beakers successively, then polymetric rinse until resistivity meter indicates 10–15MΩ.

Step 6. First CVD oxide deposition in a Tylan Furnace: the target being a layer of 200 nm.

1. The wafer is piranha cleaned for 10 minutes, 10/1 HF dip, and spin-dried.
2. Doped LTO (low temperature oxidation) uses $SiH_4$ at 60 sccm and $O_2$ at 90 sccm and $PH_3$ at 9 sccm at a pressure of about 250 mTorr, a temperature of about 450° C., and a deposition time of 10 minutes.

Step 7. Reflow doped LTO at 950° C. in a Tylan Furnace.

The wafer is exposed for 5 minutes to dry $O_2$, followed by 30 minutes to wet $O_2$, followed by 5 minutes to dry $O_2$, followed by 20 minutes to $N_2$, to anneal.

Step 8. Polysilicon deposition in a Tylan Furnace: the target being a layer of 200 nm.

The deposition time is 1 hour, at a temperature of 650° C., using $SiH_4$ at 40 sccm and $Ph_3$ at 1 sccm, at a pressure of about 320 mTorr.

Step 9. Annealing in a Tylan Furnace

The wafer is annealed with $N_2$ at 950° C. for 20 minutes, the resistivity to polysilicon then being measured with a four-point probe.

Step 10. Polysilicon Definition

Part A. The polysilicon is patterned to give the annular electrode areas, giving it Dehydration bake, HMDS (hexamethyldisilazane) treatment for 2 minutes, Spin photoresist AZ-1450J (manufactured by Shipley Co.) at 3000 rpm for 30 seconds, a softbake at 90° C. for 15 minutes, an exposure at a Canon Setting = 6.9 (align to the edges of the translucent square diaphragm), a development in a mixture of photoresist developer Microposit 351 (manufactured by Shipley Co.) and de-ionized $H_2O$ at a 1:5 ratio for about 2 minutes, rinsed in de-ionized water for 10 seconds in each of 3 beakers, then polymetric rinse and spin-dry.

This is followed by a hardbake at 120° C. for 15 minutes and an $O_2$ plasma de-scum at 50 Watts and 300 mTorr (36.7 sccm) for 2 minutes (Technics C Plasma Etcher).

Part B. Polysilicon etching (Technics C Plasma Etcher)

This may be done on gas flow rates for $SF_6$ at 13 sccm, for He at 21 sccm, at a power of 35 watts. Then etch rate is about 60 nm/min., and the etching time is about 4 minutes.

Part C. Photoresist removal

Any of the following methods can be used:

(a) 10 minutes in each of acetone, methanol and de-ionized water, successively;

(b) piranha cleaning (twice for 10 minutes each), followed by dipping in 10/1 HF for 13 seconds and rinsing in de-ionized water;

(c) plasma ashing with $O_2$ at 300 mTorr at 300 Watts for 20 minutes, or (d) using a photoresist remover, such as PRS1000 manufactured by J. T. Baker Chemical Co. at 75° C., sulfuric chromic acid mixture RT-2 manufactured by Allied Co.

Step 11. Second CVD oxide deposition and densification in a Tylan Furnace: target a second $SiO_2$ layer of 200 nm over the polysilicon electrodes.

1. Undoped LTO is used here with $SiH_4$ at 60 sccm, $O_2$ at 90 sccm, and $Ph_3$ at 0 sccm. This may be done at a temperature of 450° C., a pressure of about 240 mTorr, for a deposition time of 10 minutes.
2. This is followed by annealing with $N_2$ at 900° C. for 20 minutes.

Step 12. ZnO deposition (MRC Planar Magnetron Sputtering System): the target being a 300 nm layer.

The sputtering conditions may be:

A gas mixture of 50% Ar, 50% $O_2$, a pressure of 10 mTorr, a Forward power of 200 Watts, and substrate temperature of 200° C.

The deposition rate is about 20 nm/min. and the total deposition time is about 15 minutes.

Step 13. ZnO definition.

Part A. Photolithography (as in 10A)

Part B. ZnO Wet chemical etching:

1. The ZnO film is etched for 1 minute and 10 seconds in solution of acetic acid: phosphoric acid: $H_2O$ (1:1:30); The etch rate is about 0.3 $\mu m$/minutes vertically, while the lateral etch rate is approximately 4 times higher than 0.3 $\mu m$/minutes.
2. This is followed by rinsing in de-ionized water for 10 seconds in each of three beakers, then a polymetric rinse, and then spin drying.

Part C. The photoresist may be removed by immersion in each of acetone, methanol and $H_2O$, for 10 minutes in each, successively. An alternative is to use photoresist remover PRS1000 (manufactured by J. T. Baker Chemical Co.) at 75° C., but piranha, which attacks ZnO, cannot be used.

Step 14. CVD oxide deposition in a Tylan Furnace: the target being a 200 nm layer.

1. This is done with Undoped LTO, comprising $SiH_4$ at 60 sccm, $O_2$ at 90 sccm, and $Ph_3$ at 0 sccm, at a temperature of 450° C., a pressure of about 240 mTorr, and a deposition time of 10 minutes.

Step 15. Contact hole etch.

Part A. Photolithography as in 10A.

Part B. Plasma Etch in Technics C Plasma Etcher at gas flow rates of $O_2$ for 2.0 sccm and $CHF_3$ for 7.0 sccm, at a power of 100 Watts.

The etch rate is about 50 nm/min.

Etching is done in a series of predetermined time intervals, the oxide thickness being measured between steps to estimate the etch time.

The total etch time should be about 14 minutes.

Part C. Buffered HF etch.

Etching is done in a series of intervals of about 30 seconds, oxide thickness being measured between steps to estimate the end point of the etching.

The total etch time should be about 2.5 minutes.

Part D. The photoresist is then removed in photoresist remover PRS1000 (manufactured by J. T. Baker Chemical Co.) at 75° C., and the wafer rinsed in de-ionized water. Then the wafer is $O_2$ plasma cleaned at 100 Watts for 20 minutes in Technics C.

Step 16. Metallization (sputter film system) the target being electrodes of 500 nm.

1. The wafer is dipped in 25/1 HF for 10 seconds just before metallization.

2. A target comprised of 99% Al and 1% Si is sputtered for a total of 20 minutes at 200 Watts, with breaks of 10 minutes after each 5 minutes run.

The deposition rate is about 25 nm/min. at 200 Watts.

Step 17. Metal definition.

Part A. Photolithography (as in 10A, except that the wafer is hardbaked at 130° C. for 45 minutes instead of 120° C. for 15 minutes). The wafer is de-scummed before hardbaking.

Part B. Aluminum etch.

The etching is done with a special Al etchant that does not attack ZnO, such as a mixture of KOH: $K_3Fe(CN)_6$: $H_2O$ (1g:10g:300ml).

Part C. The photoresist is removed in photoresist remover PRS1000 (manufactured by J. T. Baker Chemical Co.) at 75° C., and the wafer is rinsed in de-ionized water.

Step 18. Sintering.

The sputtered aluminum is sintered at 400° C. in forming gas for 20 minutes.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. A method for making a miniature diaphragm pressure transducer, comprising the steps of:

depositing a thin silicon nitride film over a planar coating of thermally grown silicon dioxide on a silicon base using low-pressure chemical vapor deposition, anisotropically etching said silicon base to detach, at least partially, said film from said base and thereby provide a silicon nitride diaphragm with two faces, applying a first layer of chemical-vapor deposited silicon dioxide to one face of said diaphragm, forming a series of annular, basically concentric, polysilicon electrodes over said first layer, applying a second layer of chemical-vapor deposited silicon dioxide over said polysilicon electrodes, sputter-depositing a piezoelectric film of zinc oxide over said second layer, applying a third layer of chemical-vapor deposited silicon dioxide over said piezoelectric film, opening up some contact holes in said third and second layers, and sputter-depositing a series of annular, basically concentric, aluminum electrodes aligned with said polysilicon electrodes and having contact means extending through said contact holes to provide contact with said piezoelectric film.

2. The method of claim 1 wherein low-pressure chemical wafer deposition is done with dichlorosilane and ammonia at a gas ratio of 5 to 1 at 835° C. to produce a substantially stress-free silicon nitride film.

3. A method for making a miniature diaphragm pressure transducer, comprising the steps of:

depositing a silicon nitride film about 2 μm thick over a planar coating of thermally grown silicon dioxide on a silicon base using low-pressure chemical-vapor deposition with dichlorosilane and ammonia at a gas ratio of 5 to 1 at 835° C. to produce a substantially stress-free silicon nitride film, anisotropically etching said silicon base to detach, at least partially, said film from said base and thereby provide a silicon nitride diaphragm with two faces, applying a first layer about 0.2 μm thick of chemical-vapor deposited silicon dioxide to one face of said diaphragm, forming a series of annular, basically concentric, polysilicon electrodes about 0.2 μm high over said first layer, applying a second layer about 0.2 μm thick of chemical-vapor deposited silicon dioxide over said polysilicon electrodes, sputter-depositing a piezoelectric film about 0.3 μm thick of zinc oxide over said second layer, applying a third layer about 0.2 μm thick chemical-vapor deposited silicon dioxide over said piezoelectric film, opening up some contact holes in said second and third layers, and sputter-depositing a series of annular, basically concentric, aluminum electrodes about 0.5 μm high aligned with said polysilicon electrodes and having contact means extending through said contact holes to provide contact with said piezoelectric film.

* * * * *